United States Patent
Arlbrant

(10) Patent No.: US 11,038,482 B2
(45) Date of Patent: Jun. 15, 2021

(54) PARAMETRIC EQUALIZATION FOR AUDIO APPLICATIONS

(71) Applicant: DIRAC RESEARCH AB, Uppsala (SE)

(72) Inventor: Mattias Arlbrant, Uppsala (SE)

(73) Assignee: DIRAC RESEARCH AB, Uppsala (SE)

(*) Notice: Subject to any disclaimer, the term of this patent is extended or adjusted under 35 U.S.C. 154(b) by 18 days.

(21) Appl. No.: 16/603,395

(22) PCT Filed: Apr. 7, 2017

(86) PCT No.: PCT/SE2017/050348
§ 371 (c)(1),
(2) Date: Oct. 7, 2019

(87) PCT Pub. No.: WO2018/186779
PCT Pub. Date: Oct. 11, 2018

(65) Prior Publication Data
US 2021/0091741 A1      Mar. 25, 2021

(51) Int. Cl.
*H03G 5/00*      (2006.01)
*H03G 5/16*      (2006.01)
(Continued)

(52) U.S. Cl.
CPC .......... *H03G 5/165* (2013.01); *G10L 19/008* (2013.01); *H04S 7/307* (2013.01)

(58) Field of Classification Search
CPC .................................................. H03G 5/00
See application file for complete search history.

(56) References Cited

U.S. PATENT DOCUMENTS

| 5,737,254 A | 4/1998 | Lane et al. |
| 7,702,111 B2 | 4/2010 | Gunnarsson |

(Continued)

FOREIGN PATENT DOCUMENTS

| EP | 4879181 | 1/2008 |
| EP | 1 928 211 A2 | 6/2008 |

(Continued)

OTHER PUBLICATIONS

International Search Report, PCTSE2017/050346, dated Jan. 31, 2018.

(Continued)

*Primary Examiner* — Olisa Anwah
(74) *Attorney, Agent, or Firm* — Nixon & Vanderhye

(57) ABSTRACT

There is provided a method of determining filter coefficients for an audio filter system including a number, N≥2, of filter paths for enabling processing of N audio channels, one filter path per channel, wherein each filter path includes at least one audio filter for performing the processing of the corresponding channel. The method includes providing a common set of filter design parameters for a pair of audio filters belonging to different filter paths, including phase difference information representing an inter-channel phase difference and frequency information representing a frequency value as filter design parameters; and determining filter coefficients for the pair of audio filters at least partly based on the common set of filter design parameters.

19 Claims, 19 Drawing Sheets

---

S1: PROVIDING A COMMON SET OF FILTER DESIGN PARAMETERS FOR A PAIR OF AUDIO FILTERS BELONGING TO DIFFERENT FILTER PATHS, INCLUDING PHASE DIFFERENCE INFORMATION REPRESENTING AN INTER-CHANNEL PHASE DIFFERENCE AND FREQUENCY INFORMATION REPRESENTING A FREQUENCY VALUE AS FILTER DESIGN PARAMETERS

S2: DETERMINING FILTER COEFFICIENTS FOR THE PAIR OF AUDIO FILTERS AT LEAST PARTLY BASED ON THE COMMON SET OF FILTER DESIGN PARAMETERS

(51) Int. Cl.
*G10L 19/008* (2013.01)
*H04S 7/00* (2006.01)

(56) References Cited

U.S. PATENT DOCUMENTS

| | | | |
|---|---|---|---|
| 2004/0248533 A1* | 12/2004 | Mannermaa | H04B 1/7085 |
| | | | 455/139 |
| 2006/0056646 A1 | 3/2006 | Bharitkar | |
| 2008/0025518 A1* | 1/2008 | Mizuno | H04S 3/002 |
| | | | 381/17 |
| 2008/0253578 A1* | 10/2008 | Breebaart | H04S 1/002 |
| | | | 381/17 |
| 2009/0304213 A1 | 12/2009 | Cook | |
| 2010/0290643 A1 | 11/2010 | Mihelich et al. | |
| 2017/0070205 A1* | 3/2017 | Hashemi | H03H 9/706 |
| 2018/0302097 A1* | 10/2018 | Guo | H03L 7/1976 |

FOREIGN PATENT DOCUMENTS

| | | |
|---|---|---|
| EP | 2309781 | 4/2011 |
| EP | 2326108 | 5/2011 |
| WO | WO 2009-026066 | 2/2009 |
| WO | WO 2010-037426 | 4/2010 |
| WO | WO 2012-105886 | 8/2012 |
| WO | WO 2014-007724 | 1/2014 |
| WO | WO 2016-028199 | 2/2016 |

OTHER PUBLICATIONS

Written Opinion, PCT/SE2017/050348, dated Jan. 31, 2018.
Bristow-Johnson, "Cookbook formulae for audio Equalizer biquad filter coefficients", Adapted from hhttp://www.musicdsp.prg/files/Audio-EQ-Cookbook.txt.
Extended European Search Report issued in European Patent Application No. 17904656.0 dated Oct. 21, 2020.

* cited by examiner

PARAMETRIC EQUALIZATION FOR AUDIO APPLICATIONS

TECHNICAL FIELD

The proposed technology generally relates to audio processing and parametric equalization for audio applications, and more particularly to a method and corresponding filter control system for determining filter coefficients for an audio filter system, a parametric audio equalizer and an audio system comprising such a parametric audio equalizer, as well as a corresponding computer program and computer-program product and an audio filter system and a corresponding audio system.

BACKGROUND

In general, there is a demand for computationally efficient forms of implementation of audio filters. For example, all-pass filters exist in both analogue and digital implementations, and a very common and efficient way of implementing all-pass filters is in the form of biquadratic equalizer sections.

All-pass filters do not amplify or attenuate frequency components of a signal, instead they impose a frequency-dependent phase-shift on the input. The inter-channel phase-difference describes the frequency-dependent phase-difference between two transfer functions, taking values between −180 and +180 degrees.

The effects of all-pass filters are often highly audible when two or more channels are summed, such as in multi-channel audio systems. The reasons for this is that the inter-channel phase-difference at each frequency determines if the channels will sum constructively or destructively.

There are many applications in which inter-channel phase-difference is of great importance, for example:
- simultaneous minimization of inter-channel phase-difference in multiple listening positions [1]
- bass-management in multi-channel loudspeaker systems with subwoofers [2]
- cross-over filter design for multi-way loudspeaker systems
- stereo-width enhancement algorithms [3]
- in general applying a specific, near-constant or variable, phase-difference in a frequency band Generally, parametric audio equalizers are controlled via a small number of adjustable parameters which allow precision control of the filter response and are directly connected to features of the corresponding filter response. For a magnitude-response biquadratic equalizer, such parameters are typically gain, center frequency and Q.

For all-pass filters, a common parametric form is the single-channel all-pass biquadratic filter with two parameters; center frequency and Q.

A significant drawback of parametric biquadratic all-pass filters is the difficulty of intuitively tuning them in order to reach a desired phase-difference between channels. In practice, adjusting such filters manually can be very time consuming, especially if multiple filters per channel are available and the desired response is detailed.

SUMMARY

It is an object of the invention to provide a method of determining filter coefficients for an audio filter system.

It is another object to provide a filter control system configured to determine filter coefficients for an audio filter system.

It is also an object to provide a parametric audio equalizer.

Another object is to provide an audio system comprising such a parametric audio equalizer.

Yet another object is to provide a corresponding computer program and computer-program product.

Still another object is to provide an audio filter system, and an audio system comprising such an audio filter system.

These and other objects are met by embodiments of the proposed technology.

According to a first aspect there is provided a method of determining filter coefficients for an audio filter system comprising a number, $N \geq 2$, of filter paths for enabling processing of N audio channels, one filter path per channel, wherein each filter path comprises at least one audio filter for performing the processing of the corresponding channel. The method comprises:
- providing a common set of filter design parameters for a pair of audio filters belonging to different filter paths, including phase difference information representing an inter-channel phase difference and frequency information representing a frequency value as filter design parameters; and
- determining filter coefficients for the pair of audio filters at least partly based on the common set of filter design parameters.

In this way, a new parameterization for simultaneous control of a pair of audio filters belonging to different filter paths in a multi-channel audio filter system is introduced based on a common set of filter design parameters including phase difference information representing an inter-channel phase difference and frequency information representing a frequency value.

According to a second aspect there is provided a filter control system configured to determine filter coefficients for an audio filter system comprising a number, $N \geq 2$, of filter paths configured to enable processing of N audio channels, one filter path per channel, wherein each filter path comprises at least one audio filter configured to perform the processing of the corresponding channel. The filter control system is configured to obtain a common set of filter design parameters for a pair of audio filters belonging to different filter paths, including phase difference information representing an inter-channel phase difference and frequency information representing a frequency value as filter design parameters. The filter control system is also configured to determine filter coefficients for the pair of audio filters at least partly based on the common set of filter design parameters.

According to a third aspect there is provided a parametric audio equalizer comprising:
- an audio filter system having a number, $N \geq 2$, of filter paths configured to enable processing of N audio channels, one filter path per channel, wherein each filter path comprises at least one audio filter configured to perform the processing of the corresponding channel, and
- a parametric controller configured to control the audio filter system.

The parametric controller is configured to enable selection and/or adjustment of a common set of filter design parameters for a pair of audio filters belonging to different filter paths, including phase difference information representing an inter-channel phase difference and frequency information representing a frequency value as filter design parameters.

The parametric controller is also configured to determine filter coefficients for the pair of audio filters at least partly based on the common set of filter design parameters.

According to a fourth aspect there is provided an audio system comprising such a parametric audio equalizer.

According to a fifth aspect there is provided a computer program for determining, when executed by a processor, filter coefficients for an audio filter system comprising a number, $N \geq 2$, of filter paths for enabling processing of N audio channels, one filter path per channel, wherein each filter path comprises at least one audio filter for performing the processing of the corresponding channel. The computer program comprises instructions, which when executed by the processor, cause the processor to:

receive, as input, a common set of filter design parameters for a pair of audio filters belonging to different filter paths, including phase difference information representing an inter-channel phase difference and frequency information representing a frequency value as filter design parameters; and determine filter coefficients for the pair of audio filters at least partly based on the common set of filter design parameters.

According to a sixth aspect there is provided a computer-program product comprising a computer-readable medium having stored thereon such a computer program.

According to a seventh aspect there is provided an audio filter system determined by the method according to the first aspect.

According to an eighth aspect there is provided an audio system comprising a sound generating system and an audio filter system connected to the sound generating system, wherein the audio filter system is determined by the method according to the first aspect.

Other advantages will be appreciated when reading the following detailed description of non-limiting embodiment of the invention.

BRIEF DESCRIPTION OF DRAWINGS

The embodiments, together with further objects and advantages thereof, may best be understood by making reference to the following description taken together with the accompanying drawings, in which.

DETAILED DESCRIPTION

Throughout the drawings, the same reference designations are used for similar or corresponding elements.

Figure 1:
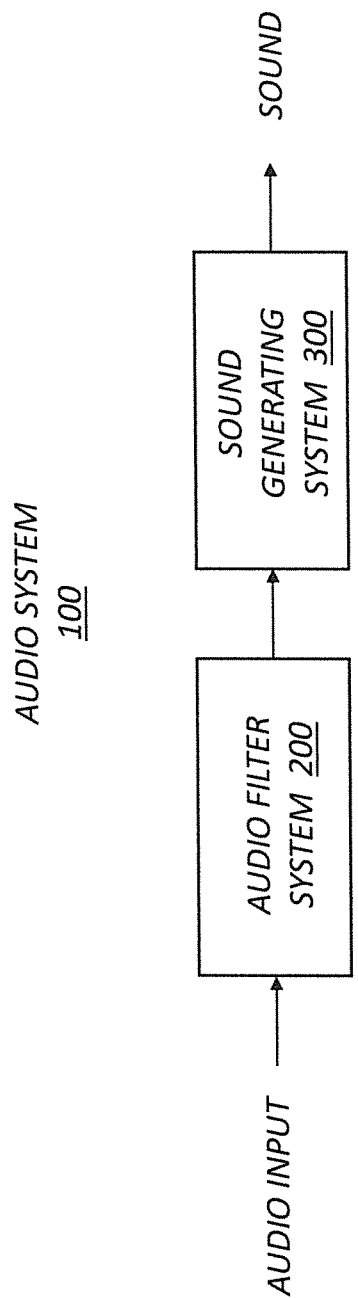
FIG. 1 is a schematic block diagram illustrating a simplified example of an audio system.

It may be useful to start with an audio system overview with reference to FIG. 1, which illustrates a simplified audio system. The audio system 100 basically comprises an audio filter system 200 and a sound generating system 300. In general, the audio filter system 200 is configured to process one or more audio input signals which may relate to one or more audio channels. The filtered audio signals are forwarded to the sound generating system 300 for producing sound.

As mentioned in the background section, a significant drawback of parametric biquadratic all-pass filters is the difficulty of intuitively tuning them in order to reach a desired phase-difference between channels. In practice, adjusting such filters manually can be very time consuming, especially if multiple filters per channel are available and the desired response is detailed.

Figure 2:
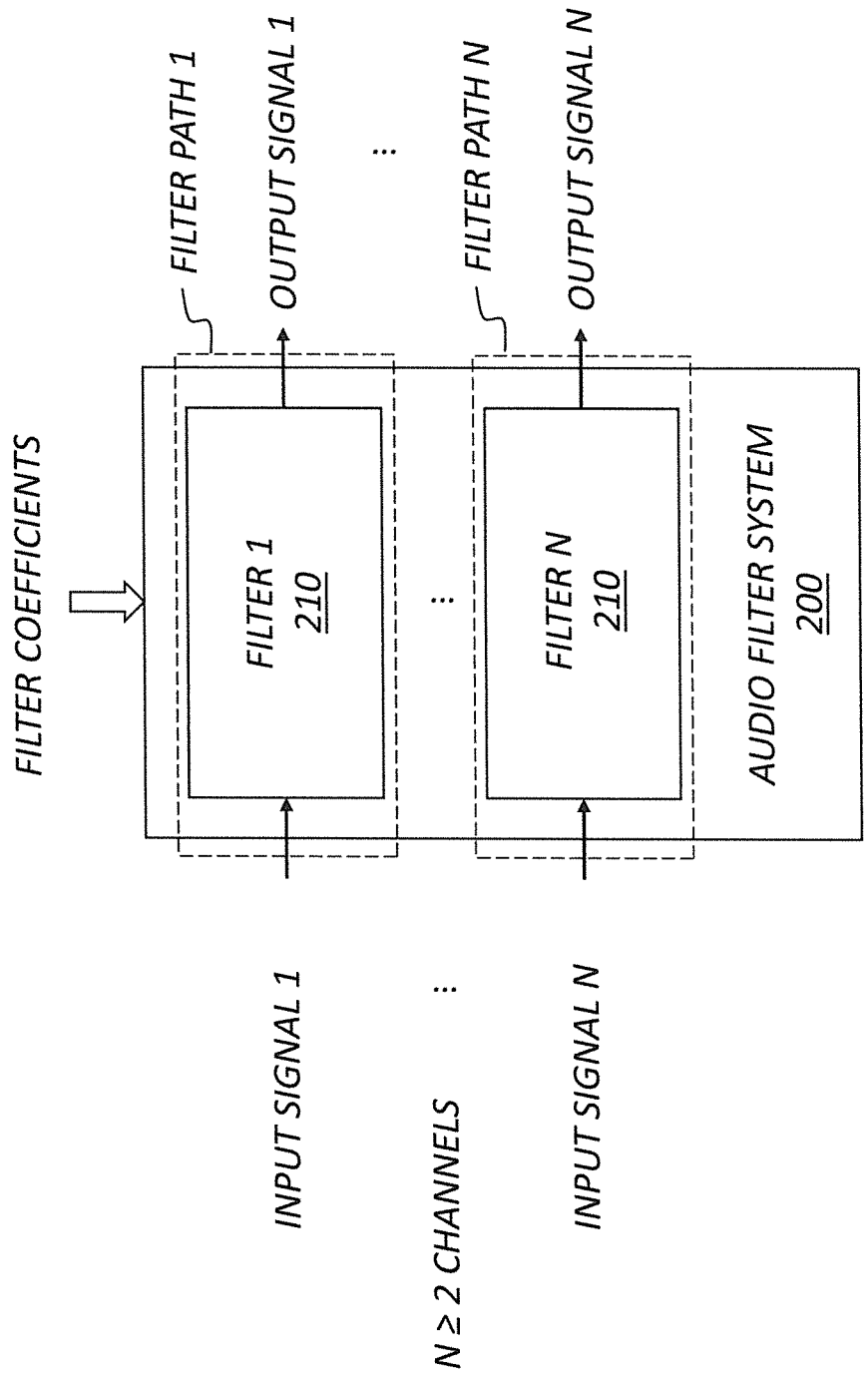
FIG. 2 is a schematic block diagram illustrating an example of an audio filter system according to an embodiment.

FIG. 2 is a schematic block diagram illustrating an example of an audio filter system according to an embodiment. In this example, the audio filter system comprises a number, $N \geq 2$, of filter paths for enabling processing of N audio channels, one filter path per channel. Each filter path of the audio filter system 200 comprises at least one audio filter 210 for performing the processing of the corresponding channel.

The inventor has recognized that what all the applications mentioned in the background have in common is that the desired filter response for achieving the desired result can be formulated, completely or partially, as an inter-channel phase-difference spectrum. In all-pass filter design for such applications, it is therefore more relevant to focus on the phase-difference between channels rather than the absolute phase per channel.

A careful analysis by the inventor has revealed the following:

A single biquadratic all-pass filter applied to one channel causes a phase shift of 360 degrees, with the maximum rate of change per frequency unit around its center frequency. The difficulty of manual tuning stems from the fact that to obtain a specific inter-channel phase difference at the center frequency without shifting the phase through a full 360 degrees at higher frequencies, a second all-pass filter needs to be applied in the other channel. The second all-pass filter will also cause a phase-shift of 360 degrees, but with opposite sign in the inter-channel phase difference. Both filters need to be adjusted co-dependently until a satisfactory inter-channel phase response has been obtained. For example, if a user has adjusted a pair of all-pass filters to reach a certain desired phase-difference but wants to move the peak of the phase-difference curve to a different frequency, the user needs to adjust the center frequencies of both filters. The user thus only has indirect control over the maximum value and center frequency phase-difference peak, via two parameters. This process is inconvenient and time consuming in practice, and has resulted in a limited use of manually tuned all-pass filters for phase-difference equalization.

A basic idea is therefore to provide a new parameterization for simultaneous control of a pair of audio filters belonging to different filter paths in a multi-channel audio filter system based on a common set of filter design parameters including phase difference information representing an inter-channel phase difference and frequency information representing a frequency value. The new parameterization facilitates the tuning of multi-channel all-pass filters, for example by engineers in an audio-lab environment.

Figure 3:
FIG. 3 is a schematic flow diagram illustrating an example of a method of determining filter coefficients for an audio filter system

FIG. 3 is a schematic flow diagram illustrating an example of a method of determining filter coefficients for an audio filter system. The audio filter system comprises a number, $N \geq 2$, of filter paths for enabling processing of N audio channels, one filter path per channel, and each filter path comprises at least one audio filter for performing the processing of the corresponding channel.

Basically, the method comprises:

S1: providing a common set of filter design parameters for a pair of audio filters belonging to different filter paths, including phase difference information representing an inter-channel phase difference and frequency information representing a frequency value as filter design parameters;

S2: determining filter coefficients for the pair of audio filters at least partly based on the common set of filter design parameters.

The proposed technology makes it easier to intuitively tune a pair of audio filters belonging to different filter paths in order to reach a desired phase-difference between the corresponding channels, by using i) a common set of filter design parameters for the audio filters and ii) including a target inter-channel phase difference value as one of the filter design parameters.

In a particular example, the method further comprises the step of providing information representing a Q value as an additional filter design parameter belonging to the common set of filter design parameters.

By way of example, the phase difference information represents a target phase difference between different channels at the output of the corresponding filter paths.

Typically, the frequency information represents a target center frequency.

Figure 7:
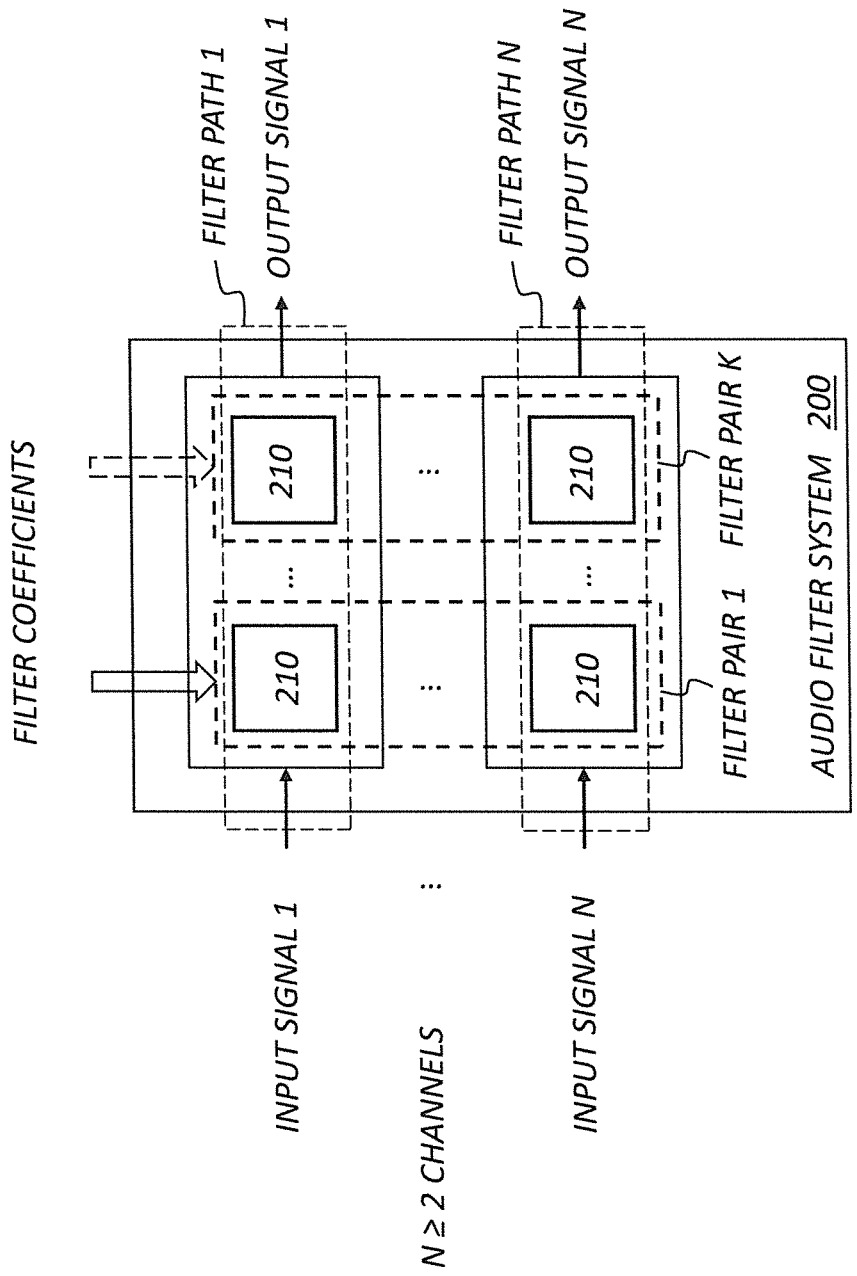
FIG. 7 is a schematic block diagram illustrating another example of an audio filter system according to an embodiment.

If multiple filters per channel are available, as illustrated in FIG. 7, more than one pair of filters may be considered for computation of filter coefficients, where each considered pair of filters belong to two different filter paths for processing different channels.

In addition, for a multi-channel system, the channels and the corresponding filter paths may be considered pair-wise, selecting one or more audio filter pairs for each considered pair of filter paths.

In other words, there may be $N \geq 2$ filter paths, one filter path per channel, and each filter path may include $K \geq 1$ filters. Using subscript notation with the number of paths/channels $i=1$ to $N$ and the number of filters per path $j=1$ to $K$, each filter denoted F may thus be distinguished from the other filters of the audio filter system by subscripts i and j, according to $F_{i,j}$. In principle, it is also possible to have different number of filters in different filter paths.

By way of example, the method may further comprise the following steps:

providing an additional, independent common set of filter design parameters for an additional, independent pair of audio filters belonging to different filter paths, including phase difference information representing an inter-channel phase difference and frequency information representing a frequency value as filter design parameters; and determining filter coefficients for the additional independent pair of audio filters at least partly based on the additional, independent common set of filter design parameters.

As an example, in a situation where there are two channels, with multiple filters per path/channel, two or more different pairs of filters may be considered for computation of filter coefficients. In this case, with only two channels/paths, the different filter pairs to be determined can be selected in the direction of j=i to K.

In another example, in a situation where there are multiple channels, with only one filter per path/channel, two or more different pairs of filters may also be considered. In this case, the different filter pairs to be determined can be selected in the direction of i=1 to N.

Of course, there may be a hybrid of the two simplified cases above, with multiple channels/paths and multiple filters per path, where the different filter pairs to be determined can be selected in the direction of both i and j.

As part of an audio equalization scheme, the method may further comprise performing simultaneous adjustment of the filter coefficients for the pair of audio filters by adjusting at least one of the filter design parameters of the common set of filter design parameters.

Typically, all of the available filter design parameters may be adjusted for simultaneously controlling the considered pair of filters, such as tuning the inter-channel phase difference value and center frequency value, or tuning the inter-channel phase difference value, center frequency value and Q value.

For example, the step of adjusting at least one of the filter design parameters of the common set of filter design parameters may be performed manually via a user interface or according to an automated or semi-automated procedure.

Although the concepts of the proposed technology may be generally applied to audio filters for parametric equalization of audio systems, the proposed technology is particularly useful when the pair of audio filters are all-pass filters or audio filters having all-pass characteristics.

It should be clear that the proposed technology also covers an audio filter system, such as that shown in FIG. 2 or FIG. 7, determined by the filter design method described herein.

Figure 6:
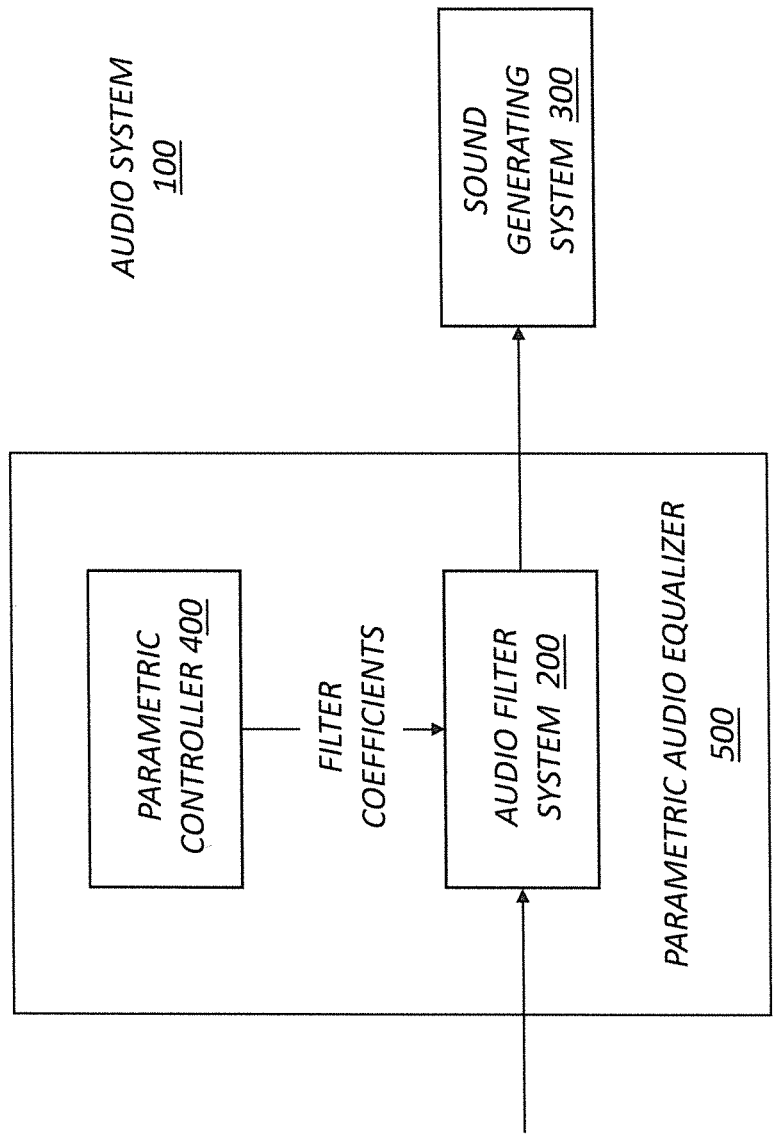
FIG. 6 is a schematic diagram illustrating an example of an audio system comprising a parametric audio equalizer in connection with a sound generating system.

In addition, the proposed technology also covers an audio system such as that shown in FIG. 1 or FIG. 6 comprising a sound generating system and an audio filter system connected to the sound generating system, wherein the audio filter system is determined by the filter design method described herein.

According to another aspect, there is provided a filter control system configured to determine filter coefficients for an audio filter system comprising a number, $N \geq 2$, of filter paths configured to enable processing of N audio channels, one filter path per channel, wherein each filter path comprises at least one audio filter configured to perform the processing of the corresponding channel.

Figure 4B:
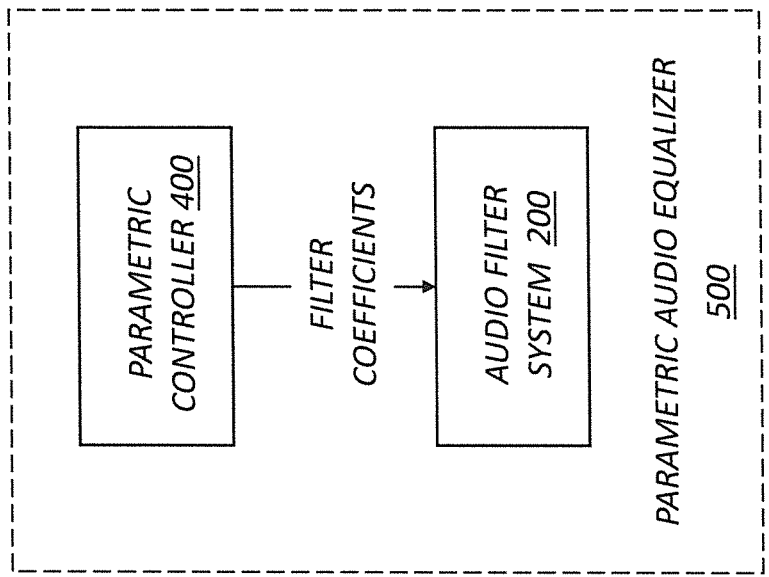
FIG. 4B is a schematic diagram illustrating an example of a specific implementation of the system combination of FIG. 4A in the form of a parametric audio equalizer.
Figure 4A:
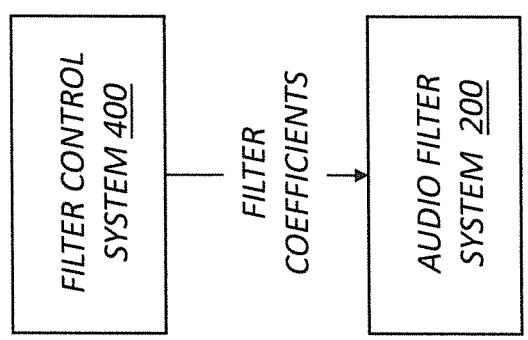
FIG. 4A is a schematic diagram illustrating an example of an audio filter system together with an associated filter control system.

FIG. 4A is a schematic diagram illustrating an example of an audio filter system 200 together with an associated filter control system 400.

FIG. 4B is a schematic diagram illustrating an example of a specific implementation of the system combination of FIG. 4A in the form of a parametric audio equalizer 500. In the example of FIG. 4B, the parametric audio equalizer 500 comprises a parametric controller 400, which is a form of filter control system, and an audio filter system 200.

According to the proposed technology, the filter control system 400 is configured to obtain a common set of filter design parameters for a pair of audio filters belonging to different filter paths, including phase difference information representing an inter-channel phase difference and frequency information representing a frequency value as filter design parameters. The filter control system 400 is also configured to determine filter coefficients for the pair of audio filters at least partly based on the common set of filter design parameters.

In a particular example, the system 400 may also be configured to obtain information representing a Q value as an additional filter design parameter belonging to the common set of filter design parameters.

By way of example, the system 400 may be configured to operate based on phase difference information representing a target phase difference between different channels at the output of the corresponding filter paths.

Typically, the system 400 is also configured to operate based on frequency information representing a target center frequency.

In a particular example, the system 400 may further be configured to obtain an additional, independent common set of filter design parameters for an additional, independent pair of audio filters belonging to different filter paths, including phase difference information representing an inter-channel phase difference and frequency information representing a frequency value as filter design parameters. The system 400 is configured to determine filter coefficients for the additional independent pair of audio filters at least partly based on the additional, independent common set of filter design parameters.

For audio equalization purposes, the system 400 may be configured to perform simultaneous adjustment of the filter coefficients for the considered pair of audio filters by adjusting at least one of the filter design parameters of the common set of filter design parameters.

By way of example, the system 400 may be configured to enable adjustment of at least one of the filter design parameters of the common set of filter design parameters manually via a user interface or according to an automated or semi-automated procedure.

As an example, the audio filters 210 are all-pass filters or audio filters having all-pass characteristics.

As will be explained in more detail later on, with reference to FIG. 18, the filter control system 400 may comprise at least one processor 401 and memory 402, the memory 402 comprising instructions, which when executed by the at least one processor 401, cause the at least one processor 401 to determine the filter coefficients.

Figure 5:
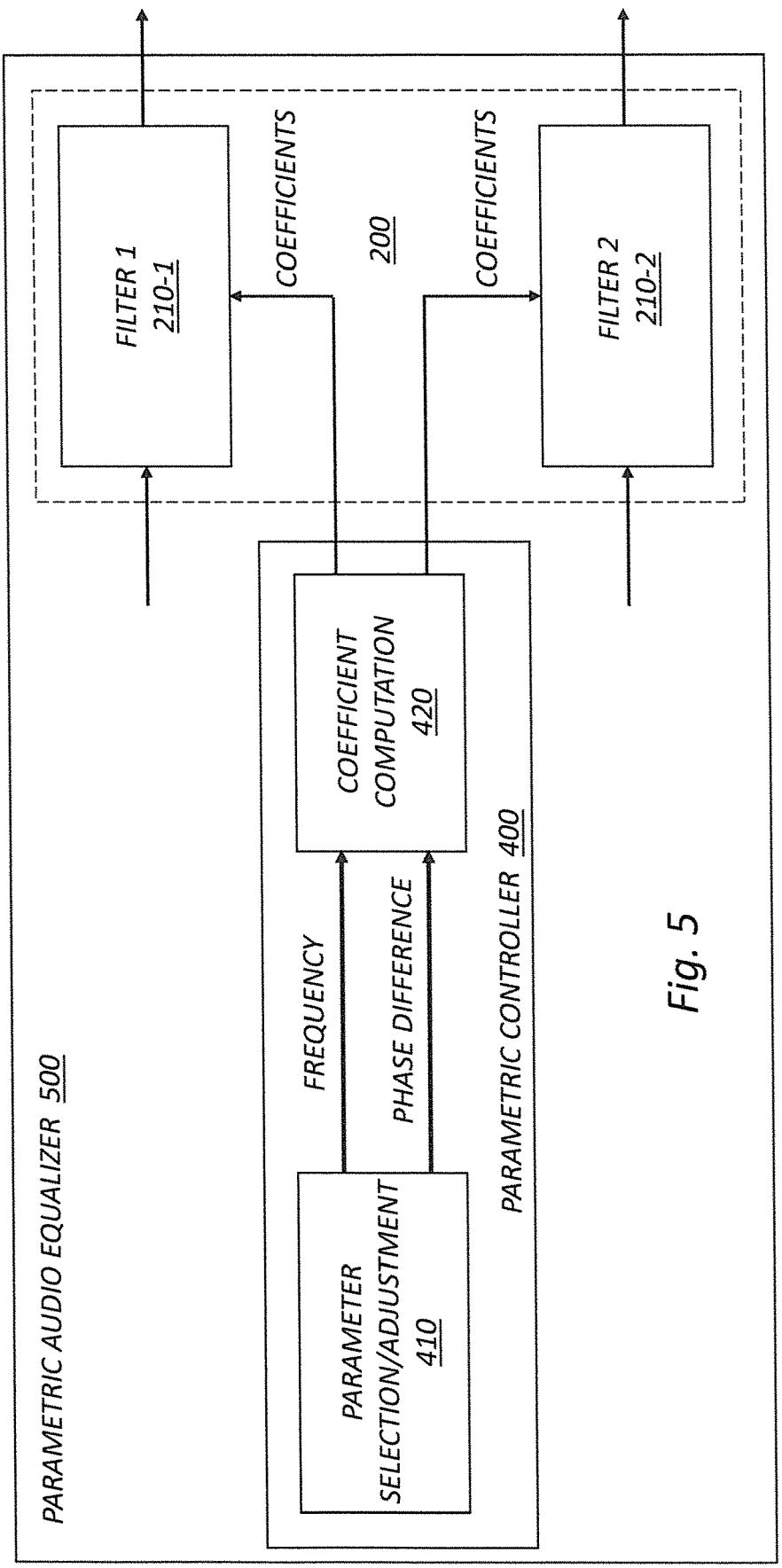
FIG. 5 is a schematic diagram illustrating an example of a parametric audio equalizer according to an embodiment.

FIG. 5 is a schematic diagram illustrating an example of a parametric audio equalizer according to an embodiment. As previously mentioned, the filter control system may be implemented as part of an audio equalizer.

According to yet another aspect of the proposed technology, there is provided a parametric audio equalizer 500 comprising an audio filter system 200 having a number, $N \geq 2$, of filter paths configured to enable processing of N audio channels, one filter path per channel, wherein each filter path comprises at least one audio filter 210 configured to perform the processing of the corresponding channel, and a parametric controller 400 configured to control the audio filter system.

The parametric controller 400 may be configured to enable selection and/or adjustment of a common set of filter design parameters for a pair of audio filters belonging to different filter paths, including phase difference information representing an inter-channel phase difference and frequency information representing a frequency value as filter design parameters. The parametric controller 400 may also be configured to determine filter coefficients for the pair of audio filters at least partly based on the common set of filter design parameters.

As illustrated in the non-limiting example of FIG. 5, the parametric controller 400 may include a parameter selection/adjustment unit 410 for enabling selection/adjustment of values of a common set of filter design parameters such as phase difference and frequency, and a coefficient computation unit 420 for determining filter coefficients based on selected values of the common set of filter design parameters.

In a particular example, the common set of filter design parameters also includes information representing a Q value as an additional filter design parameter.

By way of example, the parametric audio equalizer 500 is configured to operate based on phase difference information representing a target phase difference between different channels at the output of the corresponding filter paths.

Typically, the parametric audio equalizer 500 is also configured to operate based on frequency information representing a target center frequency.

As an example, the parametric audio equalizer 500 may be configured to perform simultaneous adjustment of the filter coefficients for the considered pair of audio filters by adjusting at least one of the filter design parameters of the common set of filter design parameters.

For example, the parametric audio equalizer 500 may be configured to enable selection and/or adjustment of at least one of the filter design parameters of the common set of filter design parameters manually via a user interface or according to an automated or semi-automated procedure.

In a particular example, the pair of audio filters are all-pass filters or audio filters having all-pass characteristics.

In other words, the parametric audio equalizer 500 is a parametric phase-difference equalizer having a parameterization based on at least inter-channel phase difference and frequency for simultaneous control of the considered pair of audio filters.

In particular, the parametric audio equalizer 500 may be configured to enable adjustment of the inter-channel phase difference at the frequency value given by the filter design parameter representing a frequency value by adjusting the filter design parameter representing an inter-channel phase difference.

The parametric audio equalizer 500 may also be configured to enable adjustment of the center frequency of an inter-channel phase difference peak by adjusting the filter design parameter representing a frequency value, while preserving inter-channel phase difference specified by the filter design parameter representing an inter-channel phase difference.

FIG. 6 is a schematic diagram illustrating an example of an audio system 100 comprising a parametric audio equalizer 500 in connection with a sound generating system 300.

The proposed technology will now be described with reference to particular, non-limiting examples, often with reference to all pass filters. It should though be understood that the invention is not limited to these examples, which are merely illustrative.

For a better understanding of the invention, it may be useful to briefly show the conventional filter design concept when considering two different all-pass filters.

Figure 8:
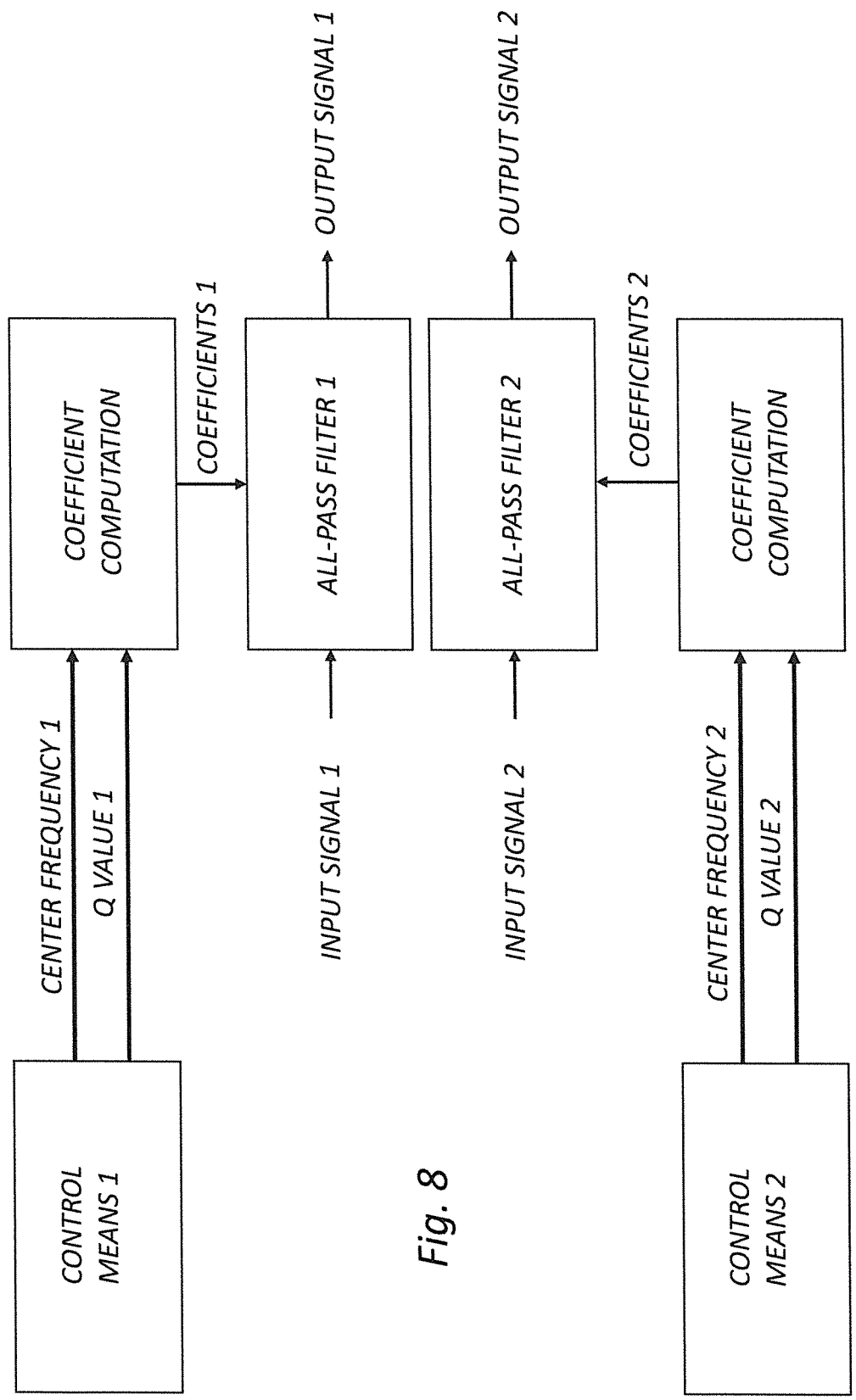
FIG. 8 is a schematic diagram illustrating an example of a conventional set-up for configuring two separate all-pass filters, using an independent set of frequency and Q values for controlling each filter.

FIG. 8 is a schematic diagram illustrating an example of a conventional set-up for configuring two separate all-pass filters, using an independent set of frequency and Q values for controlling each filter.

In this example, control means 1 adjusts the center frequency and Q value for coefficient computation for all pass filter 1, and control means 2 separately adjusts the center frequency and Q value for coefficient computation for all pass filter 2.

Figure 9:
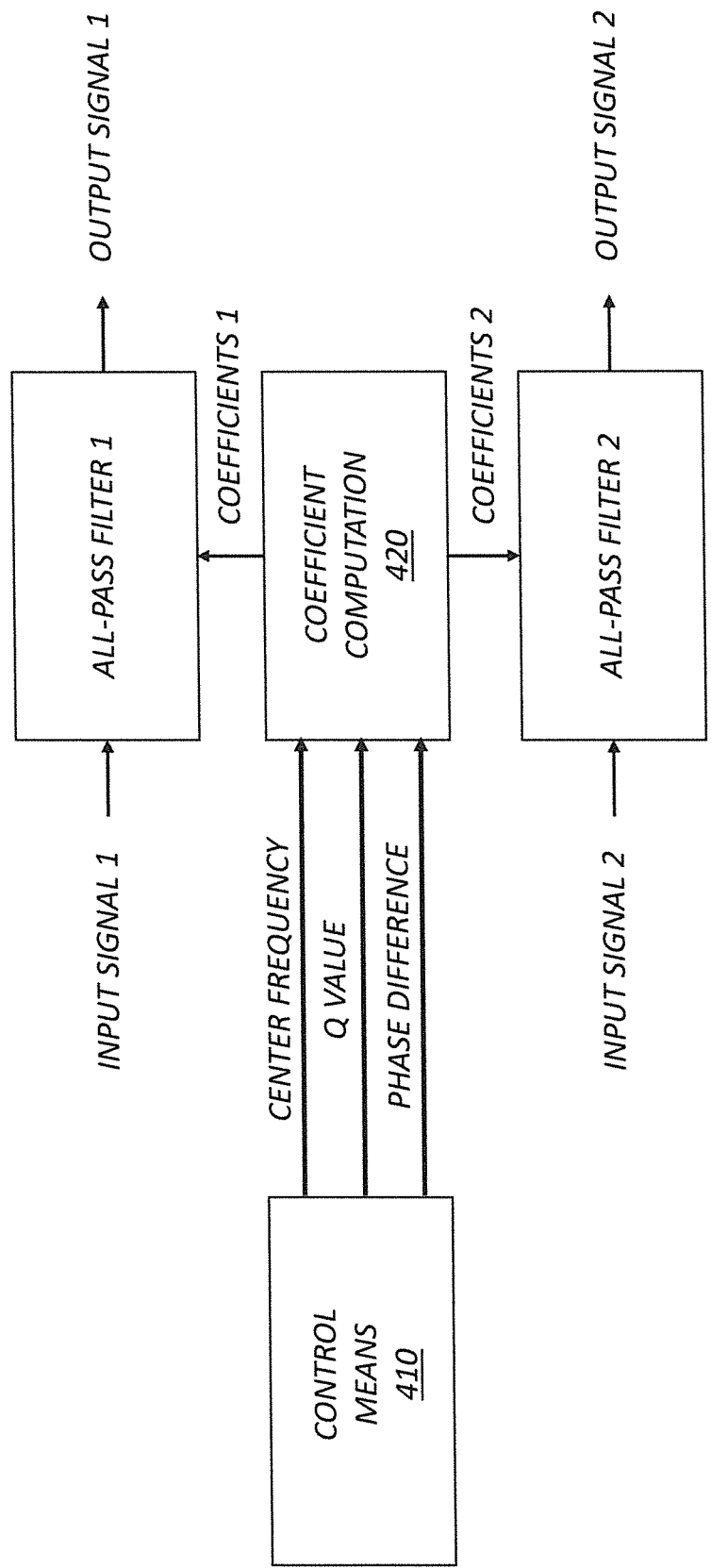
FIG. 9 is a schematic diagram illustrating a particular example of an inventive set-up for configuring a pair of all-pass filters, using a common set of filter design parameters including a phase difference, a frequency value and optionally also a Q value for controlling the filters.

FIG. 9 is a schematic diagram illustrating a particular example of an inventive set-up for configuring a pair of all-pass filters, using a common set of filter design parameters including a phase difference, a frequency value and optionally also a Q value for controlling the filters.

In this example, a common control means 410 provides a common set of filter parameters, selecting and/or adjusting a phase difference value, a center frequency and optionally a Q value for concurrently controlling the filter coefficients for two filters, all-pass filter 1 and all-pass filter 2.

Figure 10:
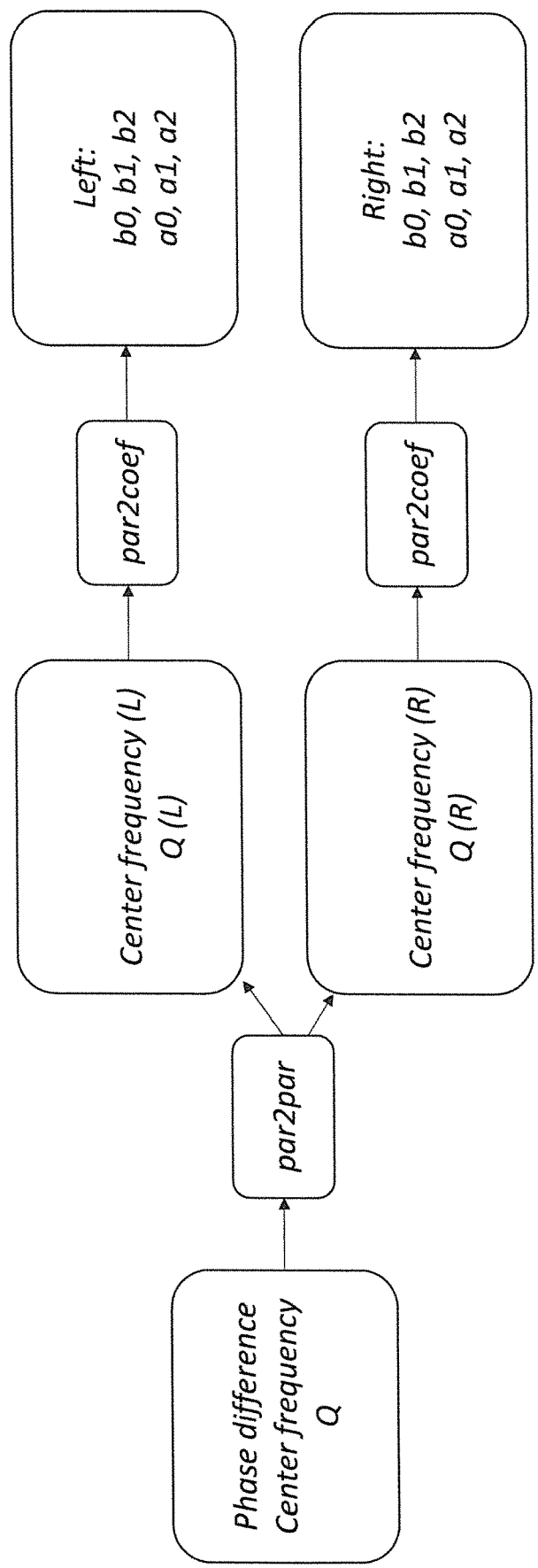
FIG. 10 is a schematic diagram illustrating an example of how the common set of filter design parameters is transformed to individual sets of filter design parameter(s), one set for each filter, and how the individual sets of filter design parameters are used to compute filter coefficients.

FIG. 10 is a schematic diagram illustrating an example of how the common set of filter design parameters is transformed to individual sets of filter design parameter(s), one set for each filter, and how the individual sets of filter design parameters are used to compute filter coefficients.

The values of the common set of filter design parameters, including a phase difference value, a center frequency and optionally a Q value, are transformed (par2par) to individual sets of one or more filter design parameters, one set for each filter. Here, it is assumed that two channels, a Left (L) channel and a Right (R) channel. Each channel is associated with an individual set of filter design parameter(s), including a center frequency and optionally also a Q value. The values of these individual sets of filter design parameter(s) are then transformed (par2coef) to respective sets of filter coefficients, one for the Left channel (L) and one of the Right (R) channel.

In a particular example, relating to so-called biquad filters, the filter coefficients for each channel include b0, b1, b2, a0, a1, a2.

For the interested reader, more information on formulas that can be used for determining filter coefficients of biquad filters can be found in reference [4].

In other words, according to a particular example of the invention, a new parameterization for simultaneous control of two audio filters is introduced. The parameters are desired phase difference, center frequency and possibly Q.

For example, the invention facilitates adjustment of the inter-channel phase-difference response by providing precise and explicit control over the inter-channel phase-difference at a center frequency with a single dedicated parameter.

Furthermore, the invention allows adjustment of the center frequency of the phase-difference peak using a single parameter, while preserving the specified phase shift. By adjusting the center frequency, the user determines where on the frequency axis the phase-difference should be modified.

By adjusting the Q-value, the user controls the bandwidth of the phase-difference modification as well as the resonance properties of the individual all-pass filters.

The simultaneous adjustment of one or more pairs of (all-pass) filters according to the invention reduces the number of parameters that the user needs to adjust in order to reach a specific phase-shift at a specific frequency.

The relation between the control parameters and the corresponding phase-difference is very similar to the relation between the parameters and the magnitude response of a conventional magnitude equalizer section.

The coefficient values for the individual all-pass filters for each combination of phase-difference, center frequency and Q can be obtained in different ways, e.g. including a look-up table with pre-computed values, an analytical formula or a numerical optimization algorithm.

For visual clarity in figures where phase or phase-difference is displayed, the phase curves have been "unwrapped" to form curves that are continuous as they cross +−180 degrees.

Figure 11:
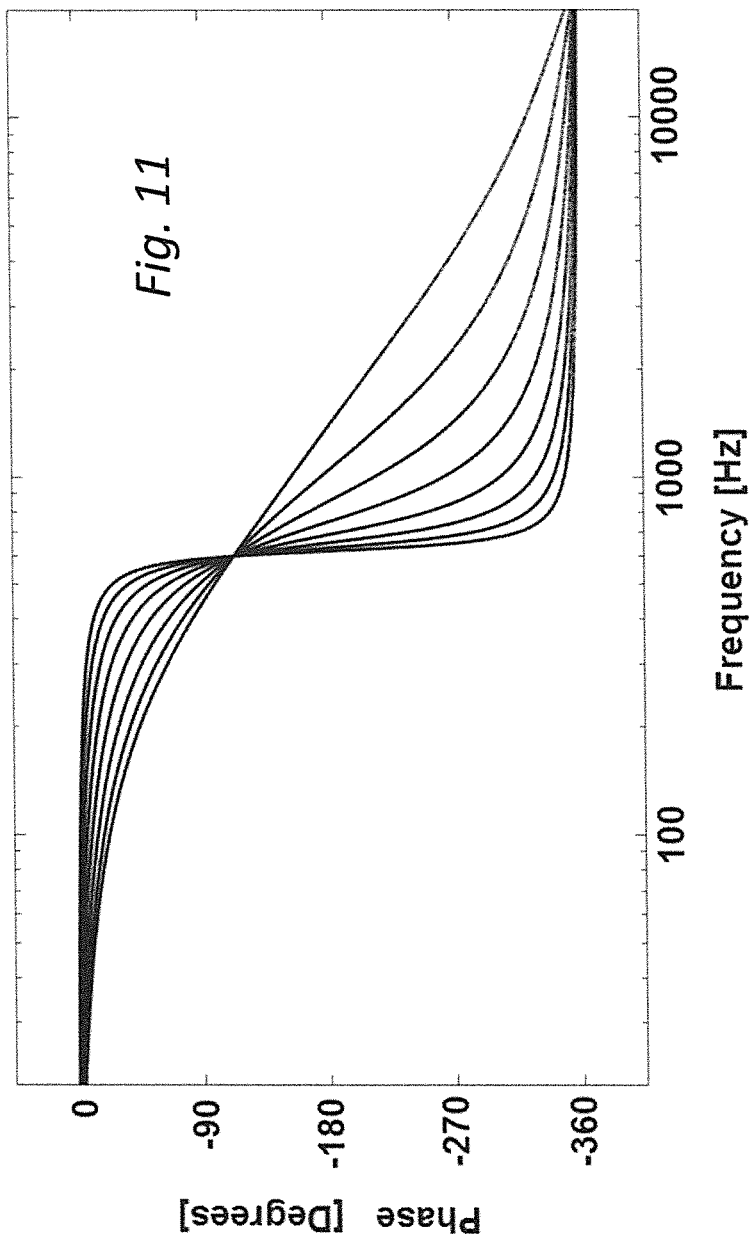
FIG. 11 is a schematic diagram illustrating an example of phase-frequency curves for a single all-pass biquad filter, with varying Q values. Higher Q values cause a more rapid phase-change around the center frequency whereas lower Q values result in a smoother phase change.

FIG. 11 is a schematic diagram illustrating an example of phase-frequency curves for a single all-pass biquad filter, with varying Q values. Higher Q values cause a more rapid phase-change around the center frequency whereas lower Q values result in a smoother phase change.

Figure 12:
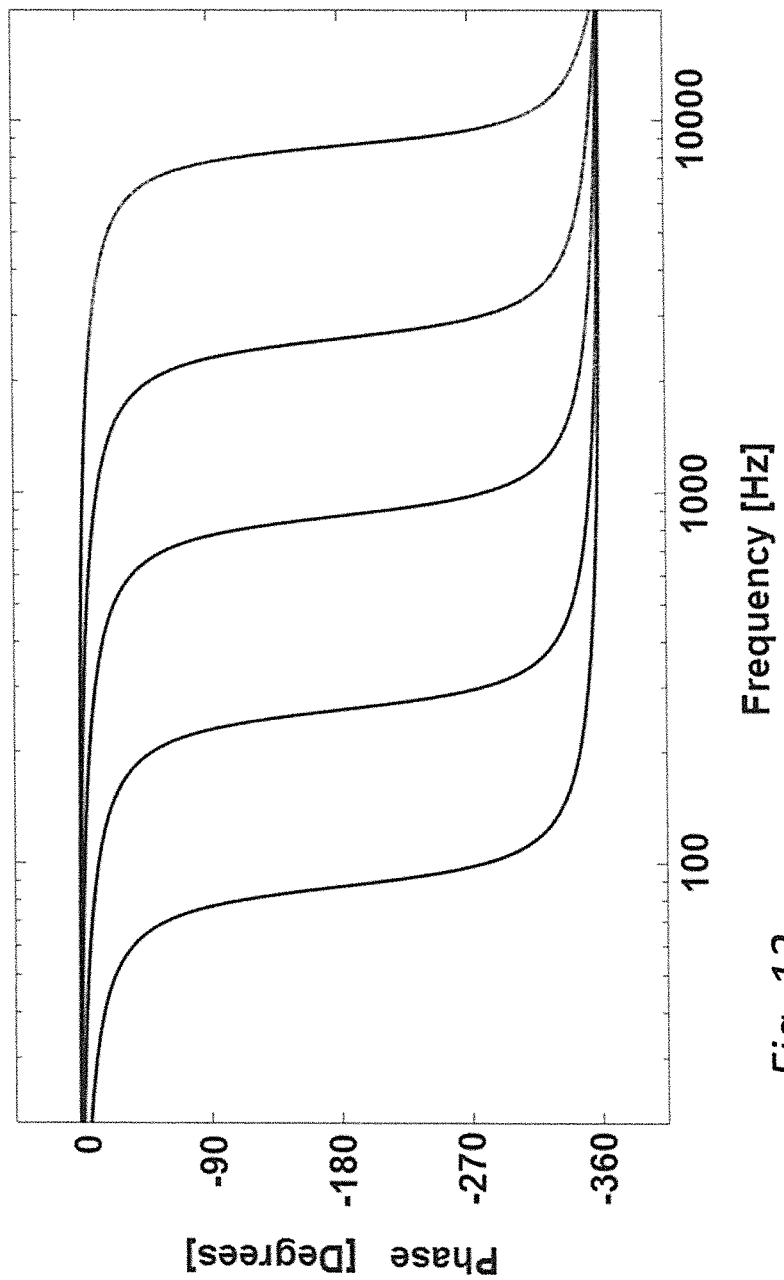
FIG. 12 is a schematic diagram illustrating an example of phase-frequency curves for a single all-pass biquad filter, with varying center frequency values. The phase curve is shifted along the frequency axis with a substantially preserved shape as the center frequency is changed.

FIG. 12 is a schematic diagram illustrating an example of phase-frequency curves for a single all-pass biquad filter, with varying center frequency values. The phase curve is shifted along the frequency axis with a substantially preserved shape as the center frequency is changed.

Figure 13:
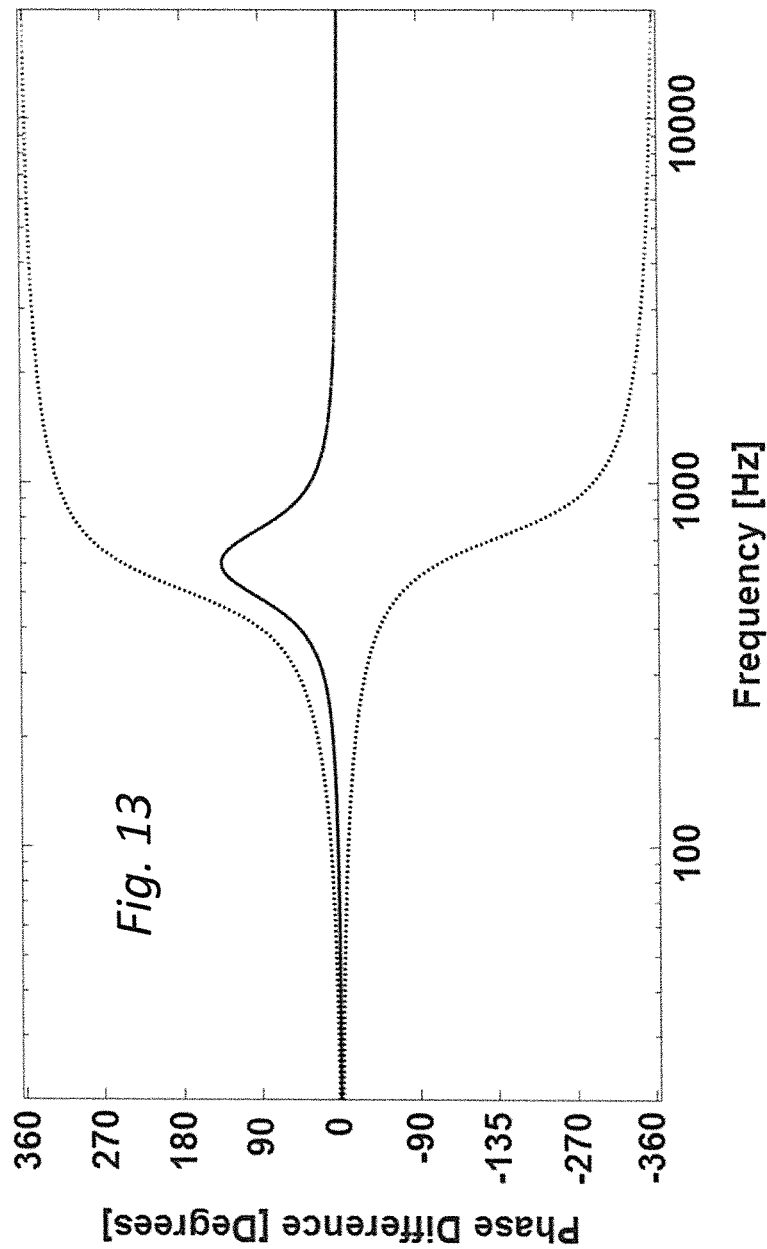
FIG. 13 is a schematic diagram illustrating an example of phase-difference curves according to an embodiment, and also the contributions from a Left channel (L) and the negative of a Right channel (−R) which add to form the phase-difference curve (L-R) of the example embodiment. The phase-difference curve exhibits a peak at a particular center frequency, with the value at the peak being equal to a particular inter-channel phase difference target value. The bandwidth of the peak is determined by a particular Q value.

FIG. 13 is a schematic diagram illustrating an example of phase-difference curves according to an embodiment, and also the contributions from a Left channel (L) and the negative of a Right channel (−R) which add to form the phase-difference curve (L-R) of the example embodiment. The phase difference exhibits a peak at a particular center frequency, with the value at the peak being equal to a particular inter-channel phase difference target value. The bandwidth of the peak may be determined by a particular Q value.

Figure 14:
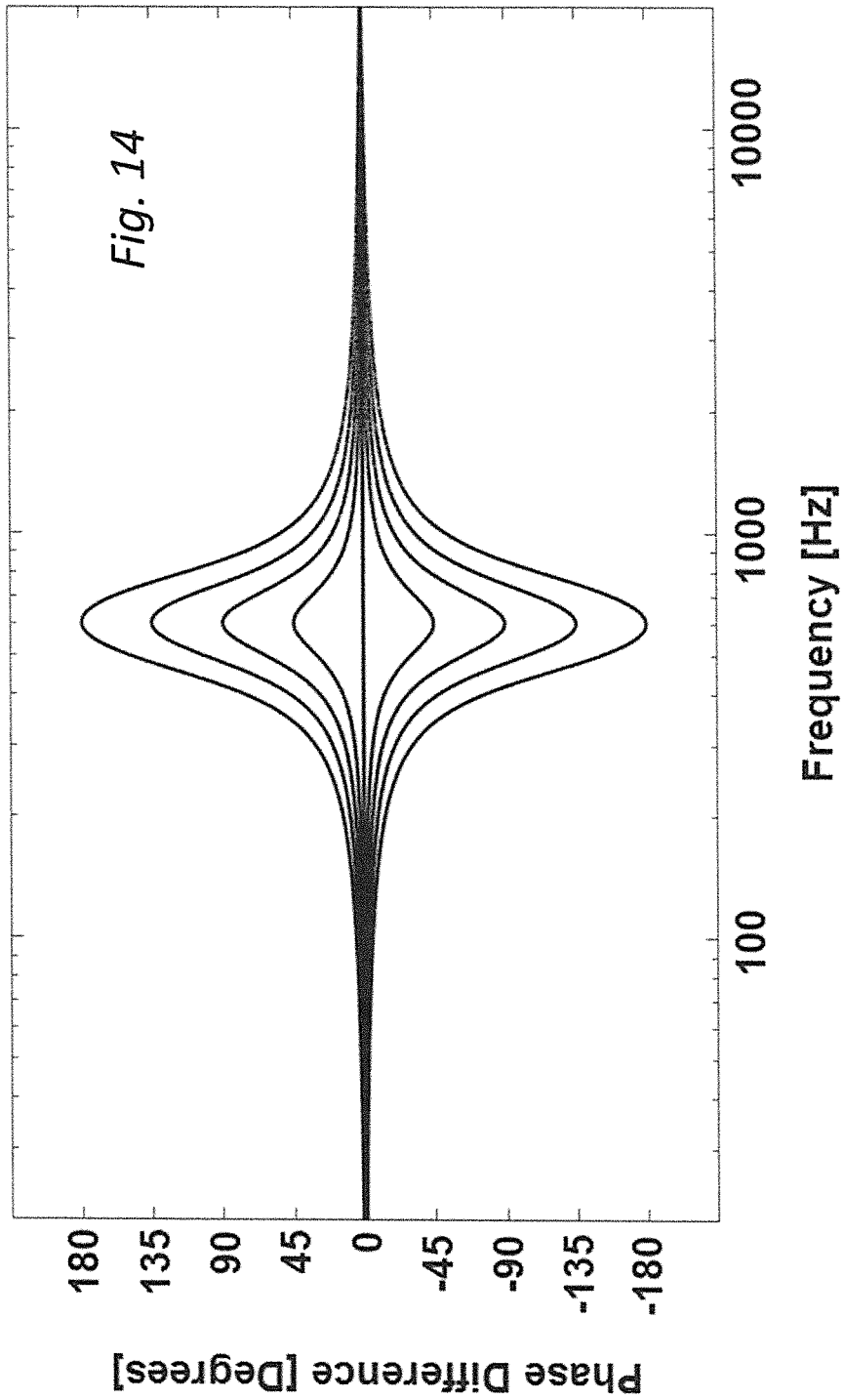
FIG. 14 is a schematic diagram illustrating an example of phase-difference curves, with varying inter-channel phase-difference target values as filter design parameter, according to an embodiment. The parameter controls the inter-channel phase difference value at the maximum of the peak of the curve when the value is positive, and at the minimum of the dip when the value is negative.

FIG. 14 is a schematic diagram illustrating an example of phase-difference curves, with varying inter-channel phase-difference target values as filter design parameter, according to an embodiment. The parameter controls the inter-channel phase difference at the maximum of the peak of the curve when the value is positive, and at the minimum of the dip when the value is negative.

Figure 15:
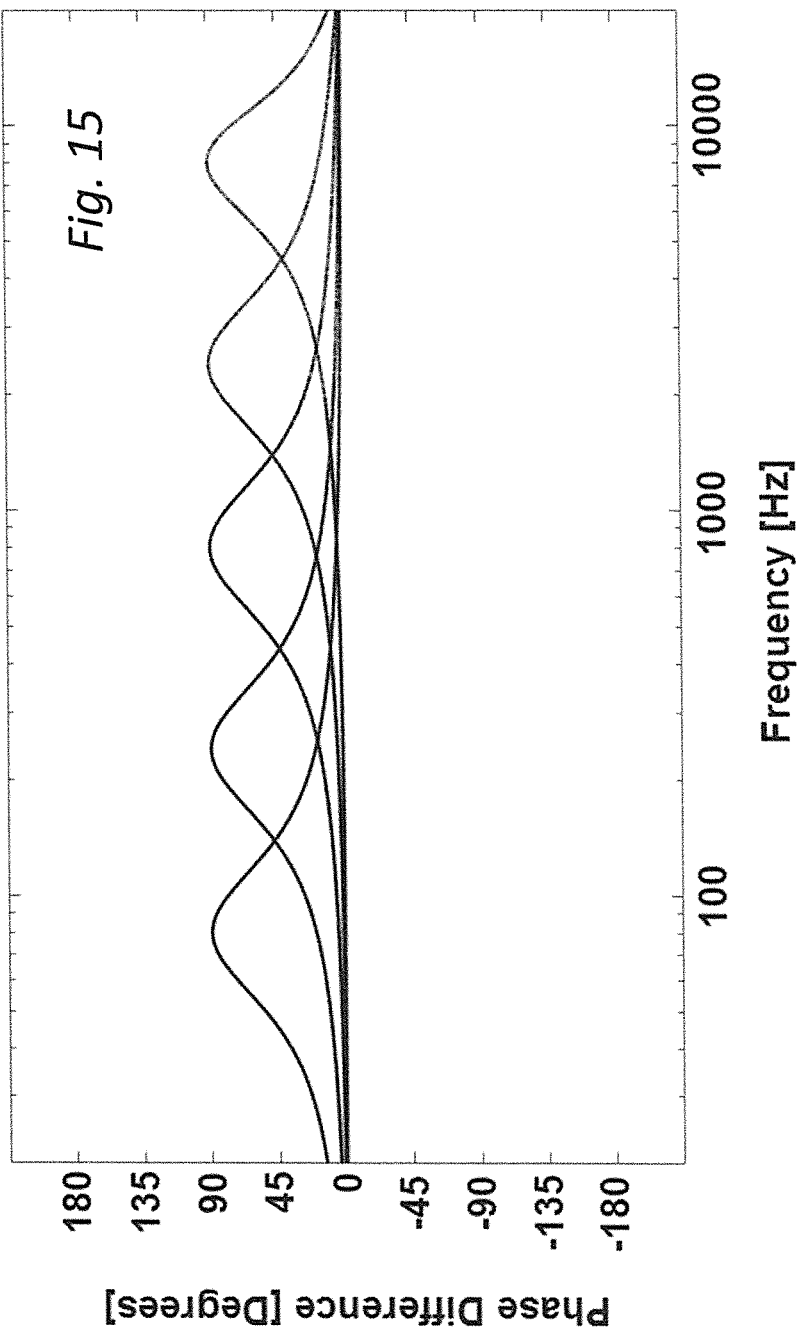
FIG. 15 is a schematic diagram illustrating an example of phase-difference curves, with varying center frequency values as filter design parameter, according to an embodiment. The phase-difference curve is shifted along the frequency axis with a substantially preserved shape as the center frequency is changed.

FIG. 15 is a schematic diagram illustrating an example of phase-difference curves, with varying center frequency values as filter design parameter, according to an embodiment. The phase-difference curve is shifted along the frequency axis with a substantially preserved shape as the center frequency is changed.

Figure 16:
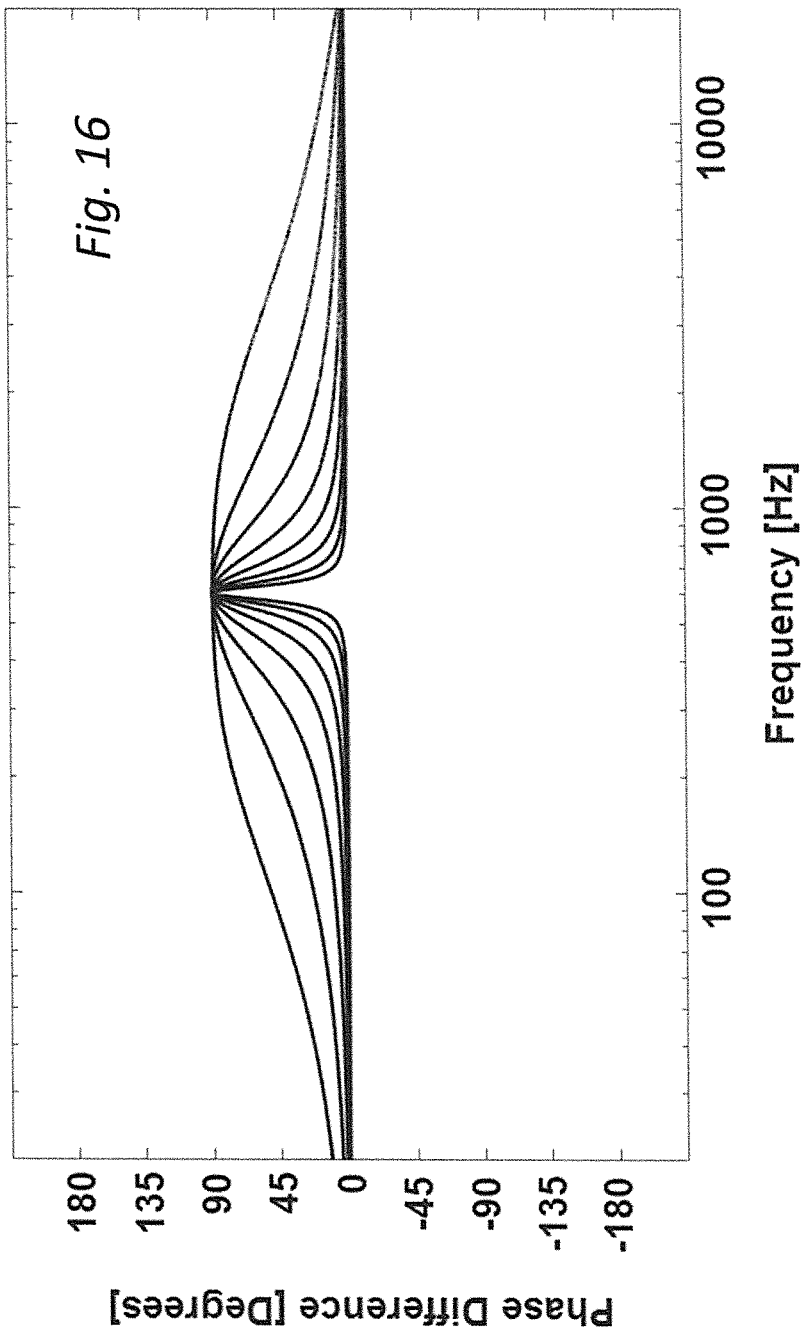
FIG. 16 is a schematic diagram illustrating an example of phase-difference curves, with varying Q values as filter design parameter, according to an embodiment. Increasing the Q value reduces the bandwidth of the frequency region affected by a change of inter-channel phase-difference, while the inter-channel phase-difference at the center frequency is kept constant. Decreasing the Q value causes the change of phase-difference to affect a wider range of frequencies.

FIG. 16 is a schematic diagram illustrating an example of phase-difference curves, with varying Q values as filter design parameter, according to an embodiment. Increasing the Q value reduces the bandwidth of the frequency region affected by a change of inter-channel phase-difference, while the inter-channel phase-difference at the center frequency is kept constant. Decreasing the Q value causes the change of phase-difference to affect a wider range of frequencies.

Figure 17:
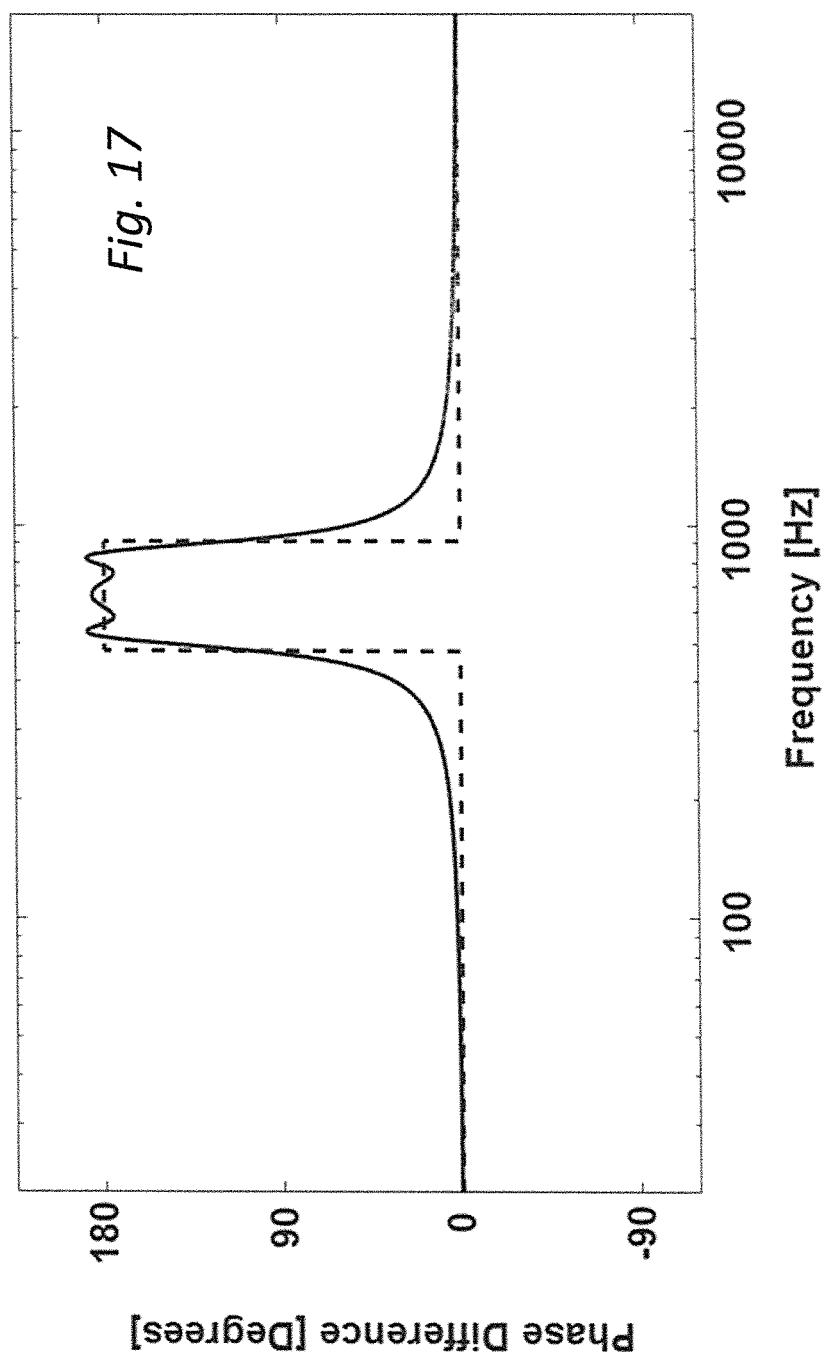
FIG. 17 is a schematic diagram illustrating an example of phase-difference curves, for a desired phase difference response curve (dashed line) and a customized phase difference response curve (solid line) as a result of using phase-difference based equalization with more than one pair of filters. The example response is composed of three filter pairs of filters whose overlapping phase-difference responses form an approximation of the desired phase-difference response curve. This is an illustration of how the unwrapped phase-difference responses of cascaded filter pairs are added to form a total phase-difference response.

FIG. 17 is a schematic diagram illustrating an example of phase-difference curves, for a desired phase difference response curve (dashed line) and a customized phase difference response curve (solid line) as a result of using phase-difference based equalization with more than one pair of filters. The example response is composed of three filter pairs of filters whose overlapping phase-difference responses form an approximation of the desired phase-difference response curve. This is an illustration of how the unwrapped phase-difference responses of cascaded filter pairs may be added to form a total phase-difference response.

It will be appreciated that the methods and arrangements described herein can be implemented, combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

Figure 18:
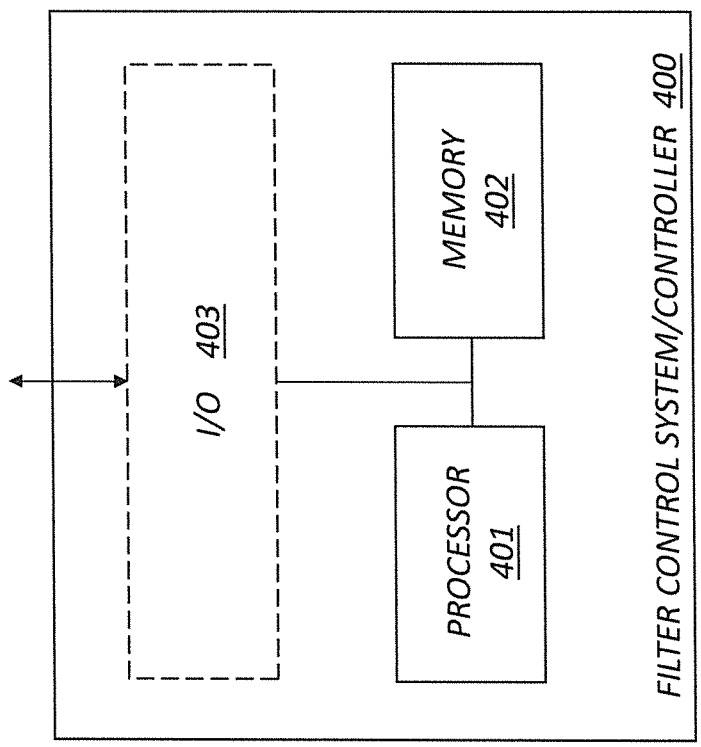
FIG. 18 is a schematic block diagram illustrating an example of a processor-memory implementation of a filter control system/controller according to an embodiment.

FIG. 18 is a schematic block diagram illustrating an example of a filter control system/controller 400, based on a processor-memory implementation according to an embodiment. In this particular example, the filter control system/controller 400 comprises a processor 401 and a memory 402, the memory 402 comprising instructions executable by the processor 401, whereby the processor is operative to implement the aspects of the proposed technology described herein, including determining filter coefficients.

Optionally, the filter control system/controller 400 may also include an input/output (I/O) device 403 to enable input and/or output of relevant data such as input parameter(s) and/or resulting output parameter(s).

It is also possible to provide a solution based on a combination of hardware and software. The actual hardware-software partitioning can be decided by a system designer based on a number of factors including processing speed, cost of implementation and other requirements.

Figure 19:
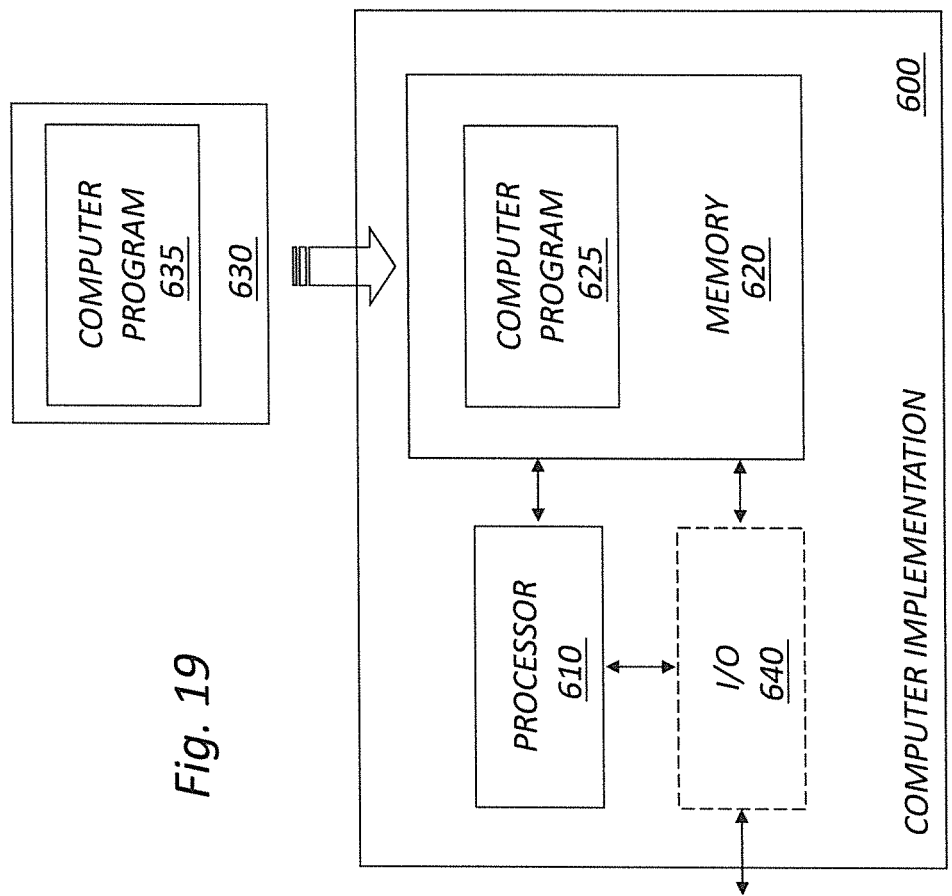
FIG. 19 is a schematic block diagram illustrating an example of a computer implementation according to an embodiment.

FIG. 19 is a schematic diagram illustrating an example of a computer-implementation 600 according to an embodiment. In this particular example, at least some of the steps, functions, procedures, modules and/or blocks described herein are implemented in a computer program 625; 635, which is loaded into the memory 620 for execution by processing circuitry including one or more processors 610. The processor(s) 610 and memory 620 are interconnected to each other to enable normal software execution. An optional input/output device 640 may also be interconnected to the processor(s) 610 and/or the memory 620 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 610 is thus configured to perform, when executing the computer program 625, well-defined processing tasks such as those described herein.

The processing circuitry does not have to be dedicated to only execute the above-described steps, functions, procedure and/or blocks, but may also execute other tasks.

In a particular embodiment, the computer program 625; 635 comprises instructions, which when executed by the processor 610, cause the processor 610 to perform the tasks described herein, including tasks related to the audio filer system. More specifically, the instructions, when executed by the processor 610, cause the processor 610 to:

receive, as input, a common set of filter design parameters for a pair of audio filters belonging to different filter paths, including phase difference information representing an inter-channel phase difference and frequency information representing a frequency value as filter design parameters; and determine filter coefficients for the pair of audio filters at least partly based on the common set of filter design parameters.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program 625; 635 may be realized as a computer program product, which is normally carried or stored on a computer-readable medium 620; 630, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

In other words, a filter design program implementing a filter design or equalization algorithm according to the proposed technology, possibly together with other relevant program modules, may be stored in peripheral memory 630 and loaded into system memory 620 for execution by processor 610. Given the relevant input data, the filter design program may calculate the filter coefficients of the audio filters.

The determined filter coefficients are normally transferred from the system memory 620 via the I/O interface 640 to the audio filters.

By way of example, the audio filters may be based on a digital signal processor (DSP) or similar processing unit, or equivalent processor, and one or more memory modules for holding the filter coefficients and delayed signal samples. The memory module(s) normally also includes a filtering program, which when executed by the processor, performs the actual filtering based on the filter coefficients Instead of transferring the calculated filter coefficients directly to the audio filters via the I/O interface 640, the filter parameters may be stored on a peripheral memory card or memory disk for later distribution to the audio filters, which may or may not be remotely located from the filter design system. The calculated filter coefficients may also be downloaded from a remote location, e.g. via the Internet, and then preferably in encrypted form.

The audio filters and the audio filter system may be realized as standalone equipment in a digital signal processor or computer that has an analog or digital interface to the associated sound system. Alternatively, the audio filters and the audio filter system may be integrated into the construction of a digital preamplifier, a D/A converter, a computer sound card, a compact stereo system, a home cinema system, a computer game console, a TV, an MP3 player docking station, a smartphone, a tablet, a laptop computer, or any other device or system aimed at producing sound.

It is also possible to realize the audio filters in a more hardware-oriented manner, with customized computational hardware structures, such as FPGAs or ASICs.

The procedural flows presented herein may be regarded as a computer flows, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

Alternatively it is possible to realize the function modules predominantly by hardware modules, or alternatively by hardware, with suitable interconnections between relevant modules. Particular examples include one or more suitably configured digital signal processors and other known electronic circuits, e.g. discrete logic gates interconnected to perform a specialized function, and/or Application Specific Integrated Circuits (ASICs) as previously mentioned. Other examples of usable hardware include input/output (I/O) circuitry and/or circuitry for receiving and/or sending signals. The extent of software versus hardware is purely implementation selection.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

REFERENCES

[1] US 2009/0304213
[2] US 2006/0056646
[3] U.S. Pat. No. 7,702,111
[4] *Cookbook formulae for audio EQ biquad filter coefficients*, by Robert Bristow-Johnson

The invention claimed is:

1. A method of determining filter coefficients for an audio filter system comprising a number, N≥2, of filter paths for enabling processing of N audio channels, one filter path per channel, wherein each filter path comprises at least one audio filter for performing the processing of the corresponding channel, wherein the method comprises:

providing a common set of filter design parameters for a pair of audio filters belonging to different filter paths, including phase difference information representing an inter-channel phase difference and frequency information representing a frequency value as filter design parameters; and determining filter coefficients for the pair of audio filters at least partly based on the common set of filter design parameters.

2. The method of claim 1, wherein the method further comprises the step of providing information representing a Q value as an additional filter design parameter belonging to the common set of filter design parameters.

3. The method of claim 1, wherein the phase difference information represents a target phase difference between different channels at the output of the corresponding filter paths.

4. The method of claim 1, wherein the frequency information represents a target center frequency.

5. The method of claim 1, wherein the method further comprises:
providing an additional, independent common set of filter design parameters for an additional independent pair of audio filters belonging to different filter paths, including phase difference information representing an inter-channel phase difference and frequency information representing a frequency value as filter design parameters; and
determining filter coefficients for the additional independent pair of audio filters at least partly based on the additional, independent common set of filter design parameters.

6. The method of claim 1, wherein the method further comprises performing simultaneous adjustment of the filter coefficients for said pair of audio filters by adjusting at least one of the filter design parameters of the common set of filter design parameters, and wherein the step of adjusting at least one of the filter design parameters of the common set of filter design parameters is performed manually via a user interface or according to an automated or semi-automated procedure.

7. The method of claim 1, wherein the filter coefficients for said pair of audio filters correspond to a zero and pole frequency and a zero and pole Q for each audio filter.

8. A filter control system configured to determine filter coefficients for an audio filter system comprising a number, N≥2, of filter paths configured to enable processing of N audio channels, one filter path per channel, wherein each filter path comprises at least one audio filter configured to perform the processing of the corresponding channel,
wherein the filter control system is configured to obtain a common set of filter design parameters for a pair of audio filters belonging to different filter paths, including phase difference information representing an inter-channel phase difference and frequency information representing a frequency value as filter design parameters; and
wherein the filter control system is configured to determine filter coefficients for the pair of audio filters at least partly based on the common set of filter design parameters.

9. The filter control system of claim 8, wherein the system is further configured to obtain information representing a Q value as an additional filter design parameter belonging to the common set of filter design parameters.

10. The filter control system of claim 8, wherein the system is configured to operate based on phase difference information representing a target phase difference between different channels at the output of the corresponding filter paths.

11. The filter control system of claim 8, wherein the system is configured to operate based on frequency information representing a target center frequency.

12. The filter control system of claim 8, wherein the system is configured to obtain an additional, independent common set of filter design parameters for an additional independent pair of audio filters belonging to different filter paths, including phase difference information representing an inter-channel phase difference and frequency information representing a frequency value as filter design parameters; and
wherein the system is configured to determine filter coefficients for the additional independent pair of audio filters at least partly based on the additional, independent common set of filter design parameters.

13. The filter control system of claim 8, wherein the system is configured to perform simultaneous adjustment of the filter coefficients for said pair of audio filters by adjusting at least one of the filter design parameters of the common set of filter design parameters, and
wherein the system is configured to enable adjustment of at least one of the filter design parameters of the common set of filter design parameters manually via a user interface or according to an automated or semi-automated procedure.

14. The filter control system of claim 8, wherein the filter coefficients for said pair of audio filters correspond to a zero and pole frequency and a zero and pole Q for each audio filter.

15. The filter control system of claim 8, wherein the system comprises at least one processor and memory, the memory comprising instructions, which when executed by the at least one processor, cause the at least one processor to determine the filter coefficients.

16. A parametric audio equalizer comprising:
an audio filter system having a number, N≥2, of filter paths configured to enable processing of N audio channels, one filter path per channel, wherein each filter path comprises at least one audio filter configured to perform the processing of the corresponding channel, and
a parametric controller configured to control the audio filter system,
wherein the parametric controller is configured to enable selection and/or adjustment of a common set of filter design parameters for a pair of audio filters belonging to different filter paths, including phase difference information representing an inter-channel phase difference and frequency information representing a frequency value as filter design parameters; and
wherein the parametric controller is configured to determine filter coefficients for the pair of audio filters at least partly based on the common set of filter design parameters.

17. The parametric audio equalizer of claim 16, wherein the parametric audio equalizer is a parametric phase-difference equalizer having a parameterization based on at least inter-channel phase difference and frequency for simultaneous control of said pair of audio filters, and/or
wherein the parametric audio equalizer is configured to enable adjustment of the inter-channel phase difference at the frequency value given by the filter design parameter representing a frequency value by adjusting the filter design parameter representing an inter-channel phase difference, and/or
wherein the parametric audio equalizer is configured to enable adjustment of the center frequency of an inter-channel phase difference peak by adjusting the filter design parameter representing a frequency value, while preserving inter-channel phase difference specified by the filter design parameter representing an inter-channel phase difference.

18. An audio system comprising a parametric audio equalizer of claim 16.

19. A non-transitory computer-readable medium on which is stored a computer program for determining, when executed by a processor, filter coefficients for an audio filter system comprising a number, N≥2, of filter paths for enabling processing of N audio channels, one filter path per channel, wherein each filter path comprises at least one audio filter for performing the processing of the corresponding channel, wherein the computer program comprises instructions, which when executed by the processor, cause the processor to:
- receive, as input, a common set of filter design parameters for a pair of audio filters belonging to different filter paths, including phase difference information representing an inter-channel phase difference and frequency information representing a frequency value as filter design parameters; and
- determine filter coefficients for the pair of audio filters at least partly based on the common set of filter design parameters.

* * * * *